(12) United States Patent
Francisco et al.

(10) Patent No.: US 6,256,495 B1
(45) Date of Patent: Jul. 3, 2001

(54) MULTIPORT, MULTIBAND SEMICONDUCTOR SWITCHING AND TRANSMISSION CIRCUIT

(75) Inventors: Mark Francisco, Millstone Township, Monmouth County; Myung-Kul Kim, Mercer County, both of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 08/932,609

(22) Filed: Sep. 17, 1997

(51) Int. Cl.[7] .................................................... H04Q 7/20
(52) U.S. Cl. .............................. 455/426; 455/78; 455/82; 333/103
(58) Field of Search .................................... 455/550, 552, 455/553, 78, 82, 83, 426; 333/103, 104

(56) References Cited

U.S. PATENT DOCUMENTS

| | | | |
|---|---|---|---|
| 5,109,205 | * | 4/1992 | Hart et al. .............................. 333/104 |
| 5,375,257 | * | 12/1994 | Lampen .................................. 455/83 |
| 5,451,918 | | 9/1995 | Sun ........................................ 335/4 |
| 5,459,428 | | 10/1995 | Kim et al. .............................. 327/387 |
| 5,548,239 | | 8/1996 | Kohama ................................ 327/408 |
| 5,578,976 | | 11/1996 | Yao ...................................... 333/262 |
| 5,581,134 | | 12/1996 | Romerein et al. .................... 307/132 |
| 5,634,200 | * | 5/1997 | Kitakubo et al. ....................... 455/82 |
| 5,642,083 | * | 6/1997 | Kato et al. ............................. 333/103 |
| 5,748,054 | * | 5/1998 | Tonegawa et al. .................... 333/103 |
| 5,768,691 | * | 6/1998 | Matero et al. .......................... 455/78 |
| 5,809,405 | * | 9/1998 | Yamaura ............................... 455/101 |
| 5,812,939 | * | 9/1998 | Kohama ................................ 455/78 |
| 5,815,804 | * | 9/1998 | Newell et al. ........................... 455/78 |
| 5,903,821 | * | 5/1999 | Ishikzuka ............................... 455/83 |

OTHER PUBLICATIONS

Gunston, M.A.R., *Microwave Transmission–Line Impedance Data*, Van Nostrand Reinhold Company, London, England, pp. 26–36.

Kim, Myung-Kul, Shielding Effectiveness Studies for Printed Circuit Boards at Microwave Frequencies, AT & T Bell Laboratories Technical Memorandum, Sep. 20, 1994, pp. 6–13.

* cited by examiner

*Primary Examiner*—Daniel Hunter
*Assistant Examiner*—Darnell R. Armstrong
(74) *Attorney, Agent, or Firm*—Gibbons, Del Deo, Dolan Griffinger & Vecchione

(57) ABSTRACT

The specification relates to a radio frequency (RF) multiport, multiband semiconductor and transmission circuit. Each port in the multiport circuit is linked to a second port utilizing a semiconductor switching leg. A semiconductor switching leg is biased to either transport thereover an RF signal or to prevent its transport. In an embodiment of the present invention utilizing diodes as an active device within each semiconductor switching leg, a DC biasing signal is applied through an inlet and outlet inductor, thus allowing DC current to pass through the diode for biasing, but preventing RF signal loss to ground. Capacitors are used for RF signal coupling and DC blocking. One embodiment of the present invention is utilized with a dual band cellular/PCS device, with either band selectable for transmission and reception over either an internal antenna or, in the alternative, an external antenna port. Transmission from the multiport, multiband semiconductor switch to one or both antenna ports is accomplished utilizing stripline with via arrays incorporated within the multi-layer printed circuit board.

25 Claims, 4 Drawing Sheets

MULTIPORT, MULTIBAND SEMICONDUCTOR SWITCHING AND TRANSMISSION CIRCUIT

FIELD OF THE INVENTION

The present invention relates to the field of RF transmission, and more particularly to semiconductor switching and radio frequency signal transport within a multi-layered printed circuit board configuration.

BACKGROUND OF THE INVENTION

Mobile Cellular and Personal Communication Service (PCS) devices typically provide for transmission and reception of signals through one of two antenna configuration options. One option is to transmit and receive through an internal antenna, permanently attached to the device itself, and provided so that the device always remains portable and mobile. The second option is to use an external antenna, often a car mounted antenna and usually connected via an accessory transmission cable from an adapter on the device to a connector configured to deliver and receive transmissions over the external antenna. Selection between the two antennas is accomplished utilizing a switch. Implementation of an antenna selection and porting switch in practice mandates a low loss switch implementation, thereby minimizing the degradation of received signal strength and preserving transmitted power.

Additionally, most mobile handsets position the internal antenna port, and consequently the internal antenna, at the top portion of the handset, while placing the external antenna port at the bottom of the handset. Such a configuration, although ergonomically convenient for the end user, mandates the incorporation of an internal radio frequency (RF) transmission medium from the top end of the handset to the bottom end. The RF signal transmission path must be selectable via the aforementioned switch. A common prior art implementation for providing a transmission path for the RF signal from switch to external antenna port is via incorporation of a low loss RF coaxial cable from the top of the handset to the bottom external antenna port. However, this method is a costly manufacturing technique.

Furthermore, the advent of allocation of a PCS communications bandwidth has motivated many communication system manufacturers and designers to investigate methods of incorporating both PCS band transmission and cellular band transmission within one communications device. Incorporating both bands within one device provides the motivation for designers to minimize replicated components in each RF band, thereby reducing the overall complexity and cost of the new dual band devices. In consideration of the above engineering and economic restrictions, use of a common switching device, which would direct either PCS or cellular communications over either the internal or external antenna, would be most advantageous. A variety of switch types, including mechanical coxial or waveguide four-way porting switches and diversity switches, are available to accomplish the task. Mechanical coaxial or waveguide four-way porting switches, however, tend to be relatively large and extremely costly. Semiconductor diversity switches are inherently less expensive to produce and offer increased reliability as compared to mechanical type switches, but diversity switches have a drawback in that a signal must pass through two junctions within a diversity switch configuration, and therefore received and transmitted signals experience the attenuation associated with passing through two semiconductor junctions.

SUMMARY OF THE INVENTION

The present invention is a multiport, multiband semiconductor switching and transmission circuit. Although the present invention is particularly well suited for use within a dual band cellular/PCS phone, it may be utilized whenever port switching for an alternating current (AC) signal is required. Another function of the present invention is to provide an inexpensive, low-loss radio frequency (RF) transmission medium within a multi-layer printed circuit board. Switching is provided by semiconductor switches located in a plurality of switching legs from a common transmission or reception node. Semiconductor switches are biased on and off with a DC biasing signal, thus allowing an RF signal to pass through an appropriately biased switching leg. An exemplary embodiment of the present invention forward biases a diode by applying a DC current through a first inductor prior to passing through the diode. The DC current then passes through a second inductor and returns to ground. The inductor values are chosen so that the inductors act as a virtual open to high frequency AC (RF) signals while simultaneously acting as a short to the DC biasing signal. An RF signal applied on either side of the forward biased switch, passes through the switch from a first port to a second port. Capacitors are provided, as needed within a specific application, to allow high frequency RF signals to pass unimpeded while blocking the DC biasing current from passing through undesired circuit paths.

In a dual band cellular/PCS device having an internal antenna and an external antenna port, switching of transmitted and received cellular and PCS signals to either the internal antenna or the external antenna port is accomplished by linking the cellular transmitter/receiver to the internal antenna via a first semiconductor switching leg, linking the cellular transmitter/receiver to the external antenna port via a second semiconductor switching leg, linking the PCS transmitter/receiver to the internal antenna via a third semiconductor switching leg, and linking the PCS transmitter/receiver to the external antenna port via a fourth semiconductor switching leg. In effect, each of a plurality of ports is linked by a semiconductor switching leg to form a semiconductor bridge switching circuit. Each semiconductor switching leg is individually operable by applying an appropriate DC biasing signal. A DC biasing signal may also be applied to more than one switching leg to allow any combination of switching legs to operate in unison.

Advantageously, implementation of the semiconductor switching circuits within a multi-layer printed circuit board is less expensive and less prone to failure than mechanical switches. Furthermore switched signals must pass through only one semiconductor junction to arrive at the desired port, thereby minimizing the signal attenuation associated with the utilization of semiconductor diversity switches.

In one embodiment of the present invention, the semiconductor device incorporated within an individual switching leg is a diode. In another embodiment of the present invention, the circuit is implemented utilizing diode-connected bipolar transistors. Other choices for semiconductor devices are also contemplated, as would be apparent to those skilled in the art.

In yet another embodiment of the present invention as incorporated within a dual band, antenna selectable transmitting/receiving device, transport of a transmitted and/or received RF signal is provided between the previously described semiconductor switching circuit and a selected antenna over a stripline fabricated within the intermediate layers of the multi-layer printed circuit board. Via arrays are utilized, in lieu of continuous metallic side walls within the multi-layer printed circuit board, to reduce crosstalk with other stripline/microstrip incorporated within the printed circuit board and additionally to minimize electromagnetic/electrostatic disturbances with incorporated components. Advantageously, fabricating stripline within multi-layer printed circuit boards is relatively inexpensive compared to other means of RF signal transport.

BRIEF DESCRIPTION OF THE DRAWINGS

A more complete understanding of the present invention may be obtained from consideration of the following description in conjunction with the drawings in which.

DETAILED DESCRIPTION

Although the present invention is particularly well suited for use within a dual band cellular/PCS phone, the present invention may also be utilized whenever port switching of an alternating current (AC) signal is required. Additionally, the present invention may be utilized whenever a low-loss, inexpensive radio frequency (RF) transmission medium is needed for transport of an RF signal within a multi-layer printed circuit board. AC signal port switching is accomplished within the present invention utilizing a multiport, multiband semiconductor switching circuit. RF signal transport within the multi-layer printed circuit board is accomplished by manufacturing RF stripline with via arrays within the circuit board. The multiport, multiband semiconductor switching circuit and the RF stripline transmission medium, when implemented within a digital or analog dual band cellular/PCS device, are fully compatible with transmission environments which are multiplexed as well as those implementations which are not multiplexed, including, but not limited to, advanced mobile-phone service (AMPS), time-division multiple access (TDMA) multiplexing, code-division multiple access (CDMA) multiplexing, Global Systems for Multiple Communications (GSM) multiplexing, and frequency-division multiple access (FDMA) multiplexing, as well as hybrid systems incorporating a combination of multiplexing techniques.

Figure 1:
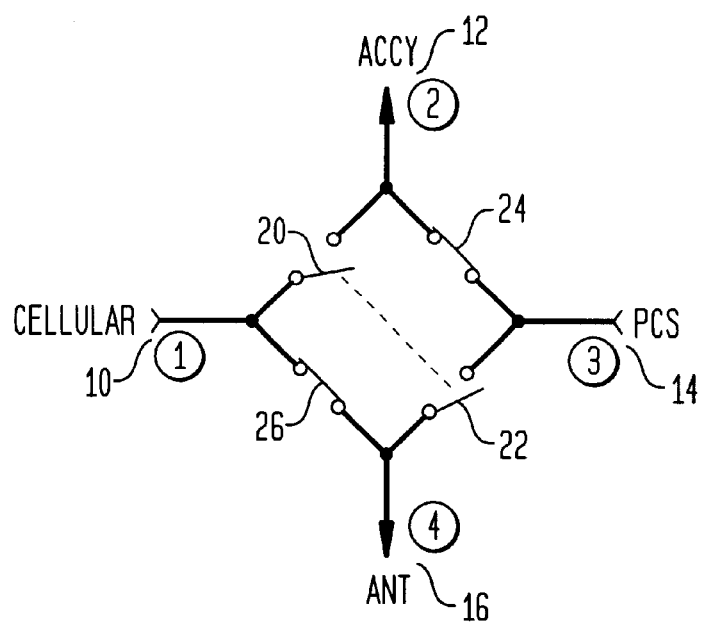
FIG. 1 is an equivalent functional representation of a multiport, multiband semiconductor ring switching circuit incorporated within a dual band device in which PORT#1 is active with PORT#4 and PORT#2 is active with PORT#3, in accordance with the present invention.

FIG. 1 is an equivalent functional representation of a multiport, multiband semiconductor switching circuit as utilized within a dual band device having an internal antenna and an external accessory antenna and in accordance with the present invention, with switch contacts shown in a first configuration state. The instant embodiment is illustrated configured with four switching legs serially interconnected in a ring topology, thereby forming a four port bridge switching circuit. A cellular transmitter and receiver are each coupled to cellular PORT#1 10. A n external accessory antenna port is available for use with an external antenna operable to transmit and receive cellular and PCS wavelength signals and is coupled to external antenna PORT#2 12. A PCS transmitter and receiver are each coupled to PCS PORT#3 14. An internal antenna is available to transmit and receive cellular and PCS wavelength signals and is coupled to internal antenna PORT#4 16. A switch 20 is provided and coupled between cellular PORT#1 10 and external antenna PORT#2 12. A second switch 24 is provided and coupled between PCS PORT#3 14 and external antenna PORT#2 12. A third switch 22 is provided and coupled between PCS PORT#3 14 and internal antenna PORT#4 16. A fourth switch 26 is provided and coupled between cellular PORT#1 10 and internal antenna PORT#4 16.

Switch contacts throughout the equivalent functional representation description are used to indicate continuity or lack of continuity between ports, and switch contacts are referred to as open or closed. That is, a closed switch represents continuity between ports on either side of the switch. Alternatively, a closed switch can be described as an active transmission path to and from the ports on either side of the switch. It may also be stated that a first port is in communication with a second port when its respective connecting switch is illustrated as closed. These alternative expressions are used when associated with the simple equivalent functional representations of a bridge switching circuit. However, since the circuit is implemented with semiconductors, a closed switch is actually representative of a forward biased semiconductor and an open switch is representative of a semiconductor which is not forward biased.

The bridge switching circuit, in a configuration state as illustrated in FIG. 1, is utilized to select and direct cellular transmitted signals from cellular PORT#1 10, through a closed switch contact 26 and to internal antenna PORT#4 16. Similarly, a cellular signal received via the internal antenna, and therefore present at internal antenna PORT#4 16, is directed through the closed switch contact 26 and to cellular PORT#1 10 for processing within the cellular receiver section of the dual band device. Therefore, cellular band transmission and reception are concurrently enabled. A PCS signal at PCS PORT#3 14 is directed through a closed switch contact 24 and to external antenna PORT#2 12 for transmission over an external accessory antenna. Similarly, a PCS signal received via the external accessory antenna, and therefore present at external antenna PORT#2 12, is directed through the closed switch contact 24 and to PCS PORT#3 14 for processing within the PCS receiver section of the dual band device. Therefore, PCS band transmission and reception are also concurrently enabled. Note that in the present configuration state, external antenna PORT#2 12 and PCS PORT#3 14 are isolated from cellular PORT#1 10 and internal antenna PORT#4 16 via open switch contacts 20,22. It should also be noted that each switch is individually controllable and therefore alternate embodiments for switch configuration would be apparent to those skilled in the art. For example, it is not required that both cellular and PCS band transport are concurrently enabled. Therefore, if the dual band device is transmitting or receiving cellular signals via the internal antenna, one embodiment of the present invention disables transmission and reception of PCS signals via the external accessory antenna by opening the switch contact 24 between PCS PORT#3 14 and external antenna PORT#2 12. Similarly, if the dual band device is transmitting or receiving PCS signals via the external accessory antenna, yet another embodiment of the present invention disables transmission and reception of cellular signals via the internal antenna by opening the switch contact 26 between cellular PORT#1 10 and internal antenna PORT#4 16.

Figure 2:
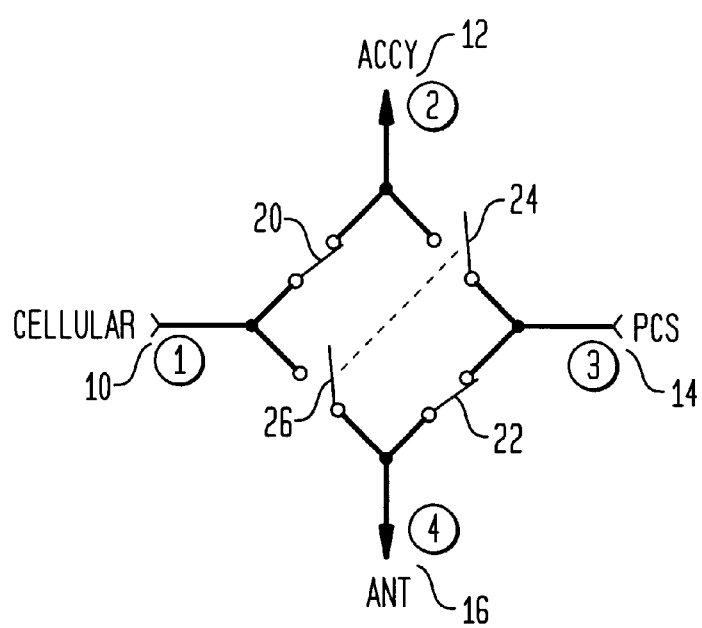
FIG. 2 is an equivalent functional representation of a multiport, multiband semiconductor ring switching circuit incorporated within a dual band device in which PORT#1 is active with PORT#2 and PORT#3 is active with PORT#4, in accordance with the present invention.

FIG. 2 is an equivalent functional representation of a multiport, multiband semiconductor switching circuit as utilized within a dual band device having an internal antenna and an external accessory antenna, and in accordance with the present invention, with switch contacts shown in a second configuration state. The switching circuit, in a configuration state as illustrated in FIG. 2, is utilized to select and direct cellular transmitted signals from cellular PORT#1 10, through a closed switch contact 20 and to external antenna PORT#2 12 for transmission. Similarly, a cellular signal received via the external accessory antenna, and therefore present at external antenna PORT#2 12, is directed through the closed switch contact 20 and to cellular PORT#1 10 for processing within the cellular receiver section of the dual band device. Therefore, cellular band transmission and reception are concurrently enabled. A PCS signal at PCS PORT#3 14 is directed through a closed switch contact 22 and to internal antenna PORT#4 16 for transmission over the internal antenna. Similarly, a PCS signal received via the internal antenna, and therefore present at internal antenna PORT#4 16, is directed through the closed switch contact 22 and to PCS PORT#3 14 for processing within the PCS receiver section of the dual band device. Therefore, PCS band transmission and reception are also concurrently enabled. Note that in the present configuration state, external antenna PORT#2 12 and cellular PORT#1 10 are isolated from PCS PORT#3 14 and internal antenna PORT#4 16 via open switch contacts 24,26. It should also be noted that each switch is individually controllable and therefore alternate embodiments for switch configuration would be apparent to those skilled in the art. For example, it is not required that both cellular and PCS band delivery are enabled concurrently. Therefore, if the dual band device is transmitting or receiving cellular signals via the external accessory antenna, another embodiment of the present invention disables transmission and reception of PCS signals via the internal antenna by opening the switch contact 22 between PCS PORT#3 14 and internal antenna PORT#4 16. Similarly, if the dual band device is transmitting or receiving PCS signals via the internal antenna, yet another embodiment of the present invention disables transmission and reception of cellular signals via the external accessory antenna by opening the switch contact 20 between cellular PORT#1 10 and external antenna PORT#2 12.

Figure 3:
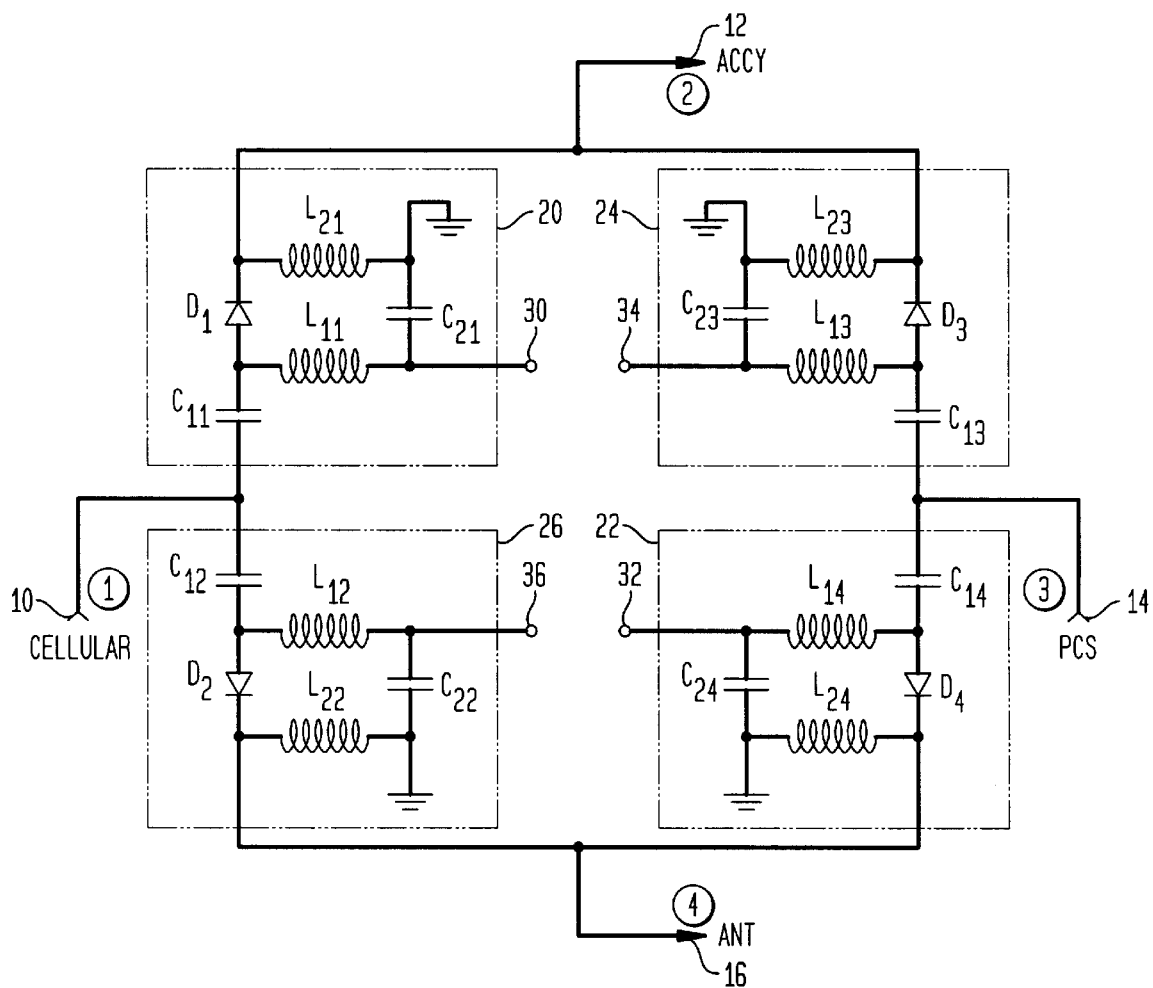
FIG. 3 is an electrical schematic of an exemplary embodiment of a multiport, multiband semiconductor switching circuit, in accordance with the present invention.

FIG. 3 is a schematic diagram of an exemplary embodiment of a multiport, multiband semiconductor switching circuit, in accordance with the present invention. The instant illustrated embodiment features a plurality of ports, each serially interlinked with another port by one of a plurality of semiconductor switching legs, thereby forming a serial ring topology. The specific embodiment illustrated is incorporated within a dual-band device capable of transmission and reception of both cellular and PCS signals and switched and ported to and from either an incorporated internal antenna or an external accessory antenna. However, the present invention is not restricted for utilization within a cellular/PCS device. The present invention may be utilized whenever low-loss RF port switching is required.

In the exemplary embodiment of the present invention illustrated in FIG. 3, a cellular transmitter and receiver are each coupled to cellular PORT#1 10. An external accessory antenna port is available for use with an external antenna operable to transmit and receive cellular and PCS wavelength signals and is coupled to external antenna PORT#2 12. A PCS transmitter and receiver are each coupled to PCS PORT#3 14. An internal antenna is available to transmit and receive cellular and PCS wavelength signals and is coupled to internal antenna PORT#4 16. A first semiconductor switch 20 is provided and coupled between cellular PORT#1 10 and external antenna PORT#2 12. The first semiconductor switch is biased to provide communication between cellular PORT#1 10 and external antenna PORT#2 12 by applying a DC bias voltage at a first semiconductor switch bias point 30, thereby allowing active RF transmission between PORT#1 10 and PORT#2 12. A second semiconductor switch 24 is provided and coupled between PCS PORT#3 14 and external antenna PORT#2 12. The second semiconductor switch 24 is biased to provide communication between PCS PORT#3 14 and external antenna PORT#2 12 by applying a DC bias voltage at a second semiconductor switch bias point 34, thereby allowing active RF transmission between PORT#3 14 and PORT#2 12. A third semiconductor switch 22 is provided and coupled between PCS PORT#3 14 and internal antenna PORT#4 16. The third semiconductor 22 switch is biased to provide communication between PCS PORT#3 14 and internal antenna PORT#4 16 by applying a DC bias voltage at a third semiconductor switch bias point 32, thereby allowing active RF transmission between PORT#3 14 and PORT#4 16. A fourth semiconductor switch 26 is provided and coupled between cellular PORT#1 10 and internal antenna PORT#4 16. The fourth semiconductor switch 26 is biased to provide communication between cellular PORT#1 10 and internal antenna PORT#4 16 by applying a DC bias voltage at a fourth semiconductor switch bias point 36, thereby allowing active RF transmission between PORT#1 10 and PORT#4 16.

The bifurcated topology of the present invention therefore allows selection of an active transmission path between a source port and one of two destination ports. Of course, multiple semiconductor switches may be tied to a single port, thereby directly increasing the number of destination ports which may be selected from a single source port. A figure demonstrating such a configuration is not illustrated, but would be apparent to those skilled in the art. An example of an embodiment wherein a multiple port switch maintains a destination port to source port ratio of greater than two would be in a tri-band transmitter and/or receiver, or alternatively within a device capable of transmission and reception over a choice between two or more antennas.

The operation of each semiconductor switch is identical with respect to equivalent components within each switching leg; therefore, only the circuit analysis of one switch is necessary to understand the instant exemplary embodiment of the present invention. Therefore, the operation of the first semiconductor switch 20 will be described. As previously established, the first semiconductor switch 20 is provided and coupled between cellular PORT#1 10 and external antenna PORT#2 12. The first semiconductor switch is biased to provide communication between cellular PORT#1 10 and external antenna PORT#2 12 by applying a DC bias voltage at the first semiconductor switch bias point 30, thereby allowing active RF transmission between PORT#1 10 and PORT#2 12. Bi-directional communication is enabled when bias is applied in that a signal may be transmitted in either direction, from PORT#1 10 to PORT#2 12 or from PORT#2 12 to PORT#1 10. A DC bias voltage applied at the first semiconductor switch bias point 30 will not pass through RF bypass capacitor $C_{21}$, but rather passes through RF choke inductor $L_{11}$, through diode $D_1$, through DC shunt inductor $L_{21}$ and returns to ground, thereby forward biasing diode $D_1$. DC blocking capacitor $C_{11}$ prevents DC voltage from being coupled back through PORT#1 10 and simultaneously provides for RF signal coupling from PORT#1 10. A similar DC blocking capacitor may be provided at PORT#2 12 if required to block DC current from entering that port, although such a configuration is not provided nor needed with the instant exemplary embodiment. By applying an appropriate DC bias voltage, RF signals are thus enabled for bidirectional transport between PORT#1 10 and PORT#2 12. Numerous modifications and alternative embodiments for semiconductor switching leg construction will be apparent to those skilled in the art in view of the foregoing description, including implementation utilizing semiconductor devices other than diodes. One such alternative embodiment utilizes bipolar transistors in a diode connected configuration. Another embodiment utilizes a bipolar transistor with switching bias applied directly to the transistor base. Yet another embodiment utilizes field effect transistors as the semiconductor device within each switching leg. The listed alternative embodiments for semiconductor switching leg construction are illustrative only, and not intended to illustrate all possible forms thereof.

Applying a DC bias voltage to the second semiconductor switch 24 at the second semiconductor switch bias point 34 similarly enables bidirectional RF transport between PORT#3 14 and PORT#2 12. Likewise, applying a DC bias voltage to the third semiconductor switch 22 at the third semiconductor switch bias point 32 enables bidirectional RF transport between PORT#3 14 and PORT#4 16. Finally, applying a DC bias voltage to the fourth semiconductor switch 26 at the fourth semiconductor switch bias point 36 enables bi-directional RF transport between PORT#1 10 and PORT#4 16. Each semiconductor switch bias point may receive a separate bias control signal and thus each switching leg 20,22,24,26 would operate independently of any other switching leg or, in the alternative, two or more switching legs may receive a common switch bias control signal and thereby operate concurrently.

For example, in one exemplary embodiment of the present invention, the first semiconductor switch bias point 30 and the third semiconductor switch bias point 32 receive the same bias control signal and therefore the first semiconductor switch 20 and the third semiconductor switch 22 operate concurrently. Similarly, the second semiconductor switch bias point 34 and the fourth semiconductor switch bias point 36 receive the same bias control signal and therefore the second semiconductor switch 24 and the fourth semiconductor switch 26 operate concurrently. This biasing arrangement will enable signal transport between cellular PORT#1 10 and external antenna PORT#2 12 and simultaneously enable signal transport between PCS PORT#3 14 and internal antenna PORT#4 16 whenever a common bias control signal is applied at the first semiconductor switch bias point 30 and the third semiconductor switch bias point 32. Similarly, signal transport is enabled between PCS PORT#3 14 and external antenna PORT#2 12 and simultaneously enabled between cellular PORT#1 10 and internal antenna PORT#4 16 whenever a common bias control signal is applied at the second semiconductor switch bias point 34 and the fourth semiconductor switch bias point.36. Other combinations of concurrent switch operation are also possible as would be readily apparent to those skilled in the art.

Figure 4:
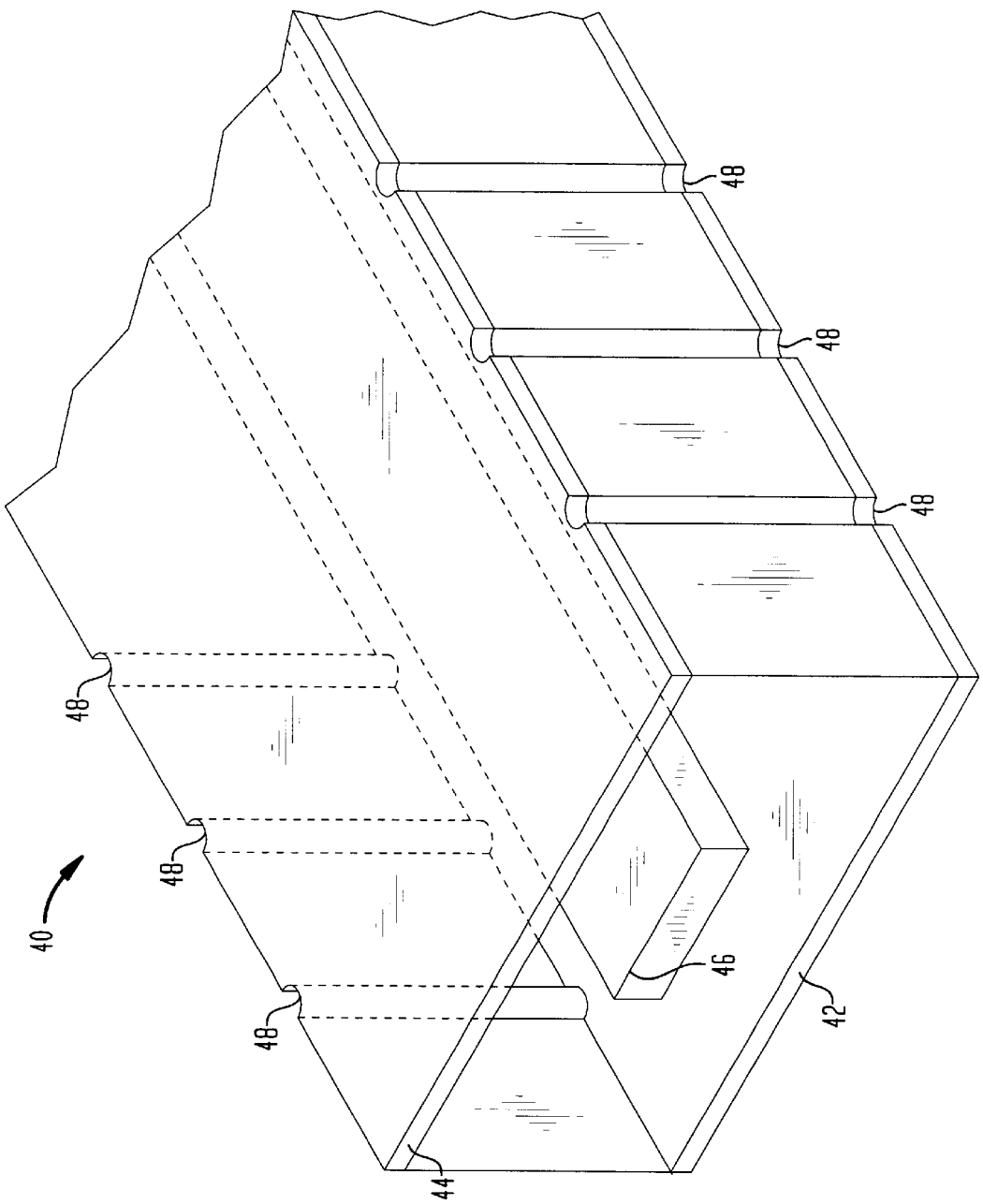
FIG. 4 is a cutaway view of a portion of stripline utilized for radio frequency transmission within a multi-layer printed circuit board.

FIG. 4 is a cutaway view of stripline 40 utilized for RF transmission within a multi-layer printed circuit board. The stripline 40 is comprised of a lower conductive plane 42, an upper conductive plane 44, and a center conductive strip 46 embedded within the multi-layer printed circuit board. Of particular importance is the placement of via arrays 48 on either side of the center conductive strip 46. Via arrays 48 are utilized, in lieu of continuous metallic side walls within the printed circuit board, to reduce crosstalk with other stripline/microstrip incorporated within the printed circuit board and additionally to minimize electromagnetic/electrostatic disturbances with incorporated components. RF signal wavelength is greater than the spacing between consecutive vias and therefore, the via arrays 48 are an effective substitute for metallic side walls. As a result, stripline 40 with via arrays 48 is utilized as an embedded rectangular transmission alternative to coaxial cable. Characteristic impedance of the stripline 40 is determined by the dimensions of the upper conductive plane 44, lower conductive plane 42, and center conductive strip 46, the relative spacing between stripline components, the dielectric constant of intermediate material, and the frequency of the RF signal transmitted thereover, as would be apparent to one skilled in the art. See, for example, M. A. R. Gunston, "Microwave Transmission-Line Impedance Data," pages 26–33 and 35–36, Van Nostrand Co., 1971; Myung-Kul Kim, "Shielding Effectiveness Studies for Printed Circuit Boards at Microwave Frequencies," AT&T Bell Laboratories Technical Memorandum, Sep. 20, 1994.

Within the context of a multiple band communications device, the switching circuit of the present invention is utilized to select RF signal transport to and from multiple antenna ports. In an embodiment of the present invention in which an internal antenna and an external antenna coupler are not located coterminously, provision must be made for transport between the multiport, multiband semiconductor switch and one or more remotely located antennas or antenna couplings. This is achieved by incorporating stripline within the device's multi-layer printed circuit board from the multiport, multiband semiconductor switch to the appropriate antenna or antennas.

Figure 5:
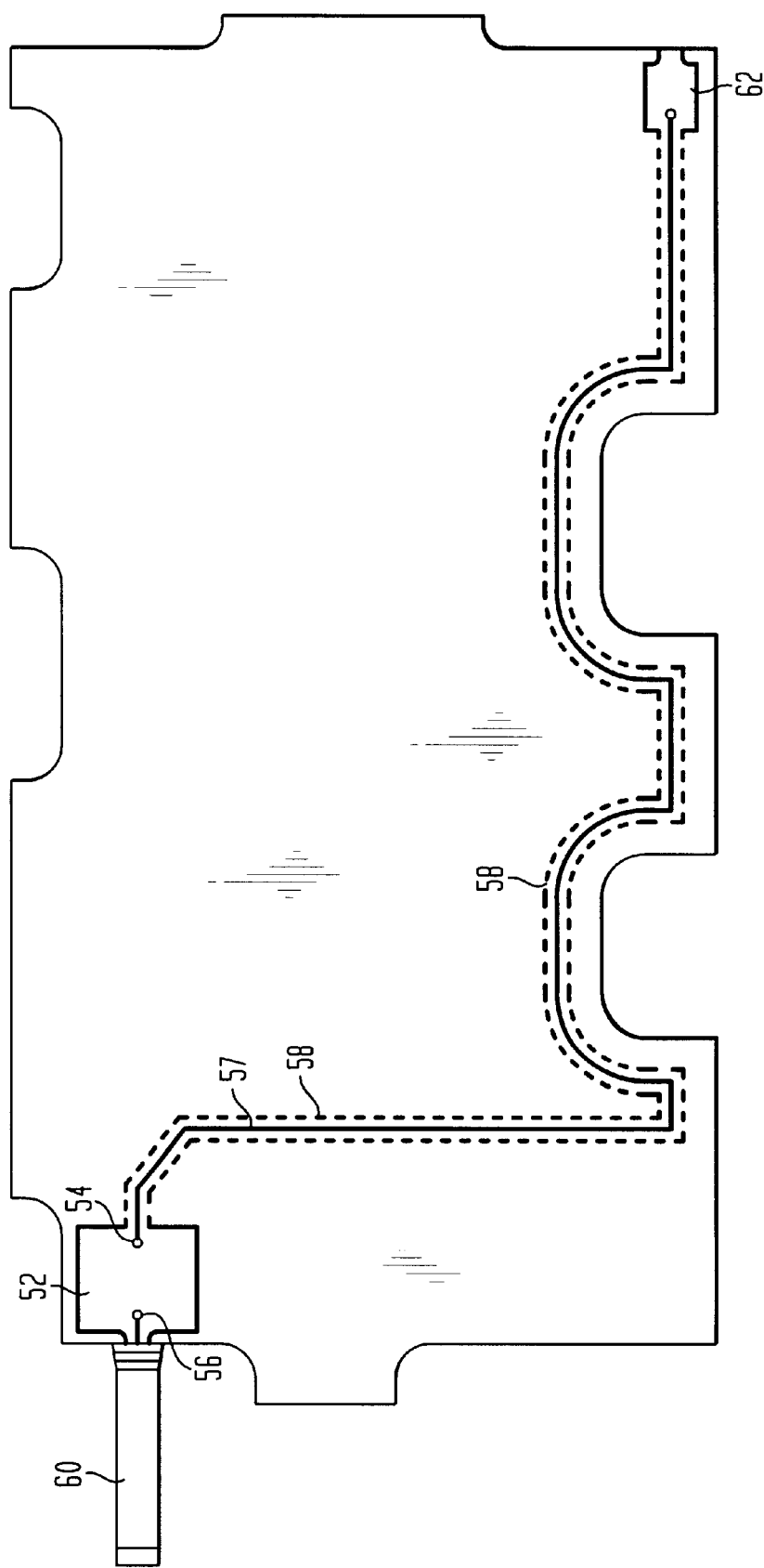
FIG. 5 is a simplified planar-view representation of an intermediate layer within a multi-layer printed circuit board illustrating the layout of one embodiment of stripline geometry with via arrays in accordance with the present invention.

FIG. 5 is a simplified planar-view representation of an intermediate layer within a multi-layer printed circuit board 50 illustrating the layout of one embodiment of stripline geometry with via arrays 58 in accordance with the present invention. Also illustrated are the multiport, multiband semiconductor switch 52 directly coupled with the device's internal antenna 60 via the switch's internal antenna outlet port 56 and the switch's external antenna outlet port 54 coupled to a stripline 57 for RF transport between the switch 52 and the external antenna outlet connector 62. The embodiment as illustrated features stripline placed primarily along the printed circuit board 50 edges, thereby in conjunction with the utilization of via arrays 58, minimizing crosstalk with other stripline/microstrip incorporated within the printed circuit board and further minimizing electromagnetic/electrostatic interference with incorporated printed circuit board components.

It would be apparent to those skilled in the art to design and configure alternative embodiments wherein the multiport, multiband semiconductor switch 52 is located at printed circuit board positions intermediate to each antenna, thus requiring signal transport over an RF transmission path to and from either the internal antenna 60 and/or the external antenna outlet connector 62. In such an embodiment, stripline is used to transport RF signals between the switch 52 and both the internal antenna 60 and the external antenna outlet connector 62.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claims are reserved.

What is claimed is:

1. A multiport semiconductor alternating current (AC) switching apparatus comprising:
    a first semiconductor switching leg coupled between a first port and a second port, said first semiconductor switching leg operable for bi-directional AC signal transport thereover in response to the application of a first DC biasing signal to said first semiconductor switching leg;
    a second semiconductor switching leg coupled between a third port and a fourth port, said second semiconductor switching leg operable for bi-directional AC signal transport thereover in response to the application of a second DC biasing signal to said second semiconductor switching leg;
    a third semiconductor switching leg coupled between said third port and said second port, said third semiconductor switching leg operable for bi-directional AC signal transport thereover in response to the application of a third DC biasing signal to said third semiconductor switching leg; and
    a fourth semiconductor switching leg coupled between said fourth port and said first port, said fourth semiconductor switching leg operable for bi-directional AC signal transport thereover in response to the application of a fourth DC biasing signal to said fourth semiconductor switching leg;
    wherein said second port and said fourth port are not coupled to a reference potential; and
    whereby either of said first port or said third port may be selectively coupled to either of said second port or said fourth port upon application of respective DC biasing signals.

2. The apparatus in accordance with claim 1 wherein said bi-directional AC signal transport is operable over personal communication service (PCS) band frequencies.

3. The apparatus in accordance with claim 1 wherein said bi-directional AC signal transport is operable over cellular band frequencies.

4. The apparatus in accordance with claim 1 wherein said bi-directional AC signal transport is operable over personal communication service (PCS) and cellular band frequencies.

5. The apparatus in accordance with claim 1 wherein transport of a radio frequency (RF) signal from said switching apparatus implemented within a multi-layer printed circuit board is by way of a stripline transmission medium.

6. The apparatus in accordance with claim 5 wherein said stripline transmission medium is constructed utilizing via arrays.

7. The apparatus in accordance with claim 6 wherein said stripline transmission medium follows an outer contour of said multi-layer printed circuit board to minimize crosstalk and electromagnetic/electrostatic disturbances with other components.

8. The apparatus in accordance with claim 1 wherein each semiconductor switching leg is implemented utilizing a diode as an active switching component, said diode having an anode and a cathode.

9. The apparatus in accordance with claim 8 further comprising:
    a choke inductor having a first end and a second end, said choke inductor first end coupled to said anode, said choke inductor second end coupled to a bias point to receive said DC biasing signal; and
    a shunt inductor having a first end and a second end, said shunt inductor first end coupled to said cathode, said shunt inductor second end electrically coupled to provide circuit continuity for said DC biasing signal.

10. The apparatus in accordance with claim 9 further comprising a bypass capacitor having a first end and a second end, said bypass capacitor first end coupled with said choke inductor second end, said bypass capacitor second end coupled with said shunt inductor second end.

11. The apparatus in accordance with claim 10 further comprising a DC blocking capacitor coupled in series between a respective port entrance and said anode, said DC blocking capacitor allowing said bi-directional AC signal transport thereover and blocking said DC biasing signal from coupling through said respective port.

12. The apparatus in accordance with claim 10 further comprising a DC blocking capacitor coupled in series between a respective port exit and said cathode, said DC blocking capacitor allowing said bi-directional AC signal transport thereover and blocking said DC biasing signal from coupling through said respective port.

13. The apparatus in accordance with claim 8 wherein said diode is implemented utilizing a diode-connected bipolar transistor.

14. In a dual band communications device operable to transmit and receive personal communication service (PCS) band and cellular band radio frequency (RF) signals through selectable antenna ports, a multiport, multiband semiconductor switching and transmission circuit comprising:
    a first diode switching leg coupled between a cellular port and a first antenna port, said first diode switching leg operable for bi-directional cellular signal transport thereover in response to the application of a first DC biasing signal to said first diode switching leg;
    a second diode switching leg coupled between said cellular port and a second antenna port, said second diode switching leg operable for bi-directional cellular signal transport thereover in response to the application of a second DC biasing signal to said second diode switching leg;
    a third diode switching leg coupled between a PCS port and said first antenna port, said third diode switching leg operable for bi-directional PCS signal transport thereover in response to the application of a third DC biasing signal to said third diode switching leg; and
    a fourth diode switching leg coupled between said PCS port and said second antenna port, said fourth diode switching leg operable for bi-directional PCS signal transport thereover in response to the application of a fourth DC biasing signal to said fourth diode switching leg;
    wherein said second port and said fourth port are not coupled to a reference potential; and
    whereby either of said first port or said third port may be selectively coupled to either of said second port or said fourth port upon application of respective DC biasing signals.

15. The circuit in accordance with claim 14 wherein each of said diode switching legs incorporates a diode-connected bipolar transistor as an active switching component.

16. The circuit in accordance with claim 14 wherein said multiport, multiband semiconductor switching and transmission circuit is manufactured within a multi-layer printed circuit board.

17. The circuit in accordance with claim 16 wherein transport of said RF signals from said selectable antenna ports to an antenna is accomplished by way of a stripline transmission medium manufactured within said multi-layer printed circuit board.

18. The circuit in accordance with claim 17 wherein said stripline transmission medium is constructed utilizing via arrays.

19. The circuit in accordance with claim 18 wherein said stripline transmission medium follows an outer contour of said multi-layer printed circuit board to minimize crosstalk and electromagnetic/electrostatic disturbances with other components.

20. A multiport alternating current (AC) signal switching and transmission circuit incorporated within a multi-layered printed circuit board comprising:
 a plurality of ports not coupled to a reference potential; and
 a plurality of switching legs, each of said plurality of switching legs coupled between two of said plurality of ports so that said plurality of ports and said plurality of switching legs form a serial ring topology, each of said plurality of switching legs including:
  a diode having an anode and a cathode;
  a choke inductor having a first end and a second end, said choke inductor first end coupled to said anode;
  a shunt inductor having a first end and a second end, said shunt inductor first end coupled to said cathode; and
  a bypass capacitor having a first end and a second end, said bypass capacitor first end coupled to said choke inductor second end, said bypass capacitor second end coupled to said shunt inductor second end,
 wherein a DC biasing signal is applied to said choke inductor second end of a respective switching leg whenever an active AC signal transport path over said respective switching leg is desired.

21. The circuit in accordance with claim 20 wherein each of said plurality of switching legs further includes a DC blocking capacitor coupled in series between a respective port entrance and said anode, said DC blocking capacitor allowing a bi-directional AC signal transport thereover and blocking said DC biasing signal from coupling through to said respective port entrance.

22. The circuit in accordance with claim 20 wherein each of said plurality of switching legs further includes a DC blocking capacitor coupled in series between a respective port exit and said cathode, said DC blocking capacitor allowing a bi-directional AC signal transport thereover and blocking said DC biasing signal from coupling through to said respective port exit.

23. The circuit in accordance with claim 20 wherein each of said plurality of switching legs is operable for transport thereover of cellular band signal frequencies.

24. The circuit in accordance with claim 20 wherein each of said plurality of switching legs is operable for transport thereover of personal communication service (PCS) band signal frequencies.

25. The circuit in accordance with claim 20 wherein each of said plurality of switching legs is operable for transport thereover of cellular band and personal communication service (PCS) band signal frequencies.

* * * * *